(12) United States Patent
Watanabe (10) Patent No.: US 7,698,800 B2
(45) Date of Patent: Apr. 20, 2010

(54) ELEMENT ARRANGEMENT METHOD

(75) Inventor: Toshihiko Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 780 days.

(21) Appl. No.: 11/034,003

(22) Filed: Jan. 11, 2005

(65) Prior Publication Data
US 2005/0196589 A1 Sep. 8, 2005

(30) Foreign Application Priority Data
Jan. 21, 2004 (JP) ............................ P2004-012828

(51) Int. Cl.
*B23Q 7/00* (2006.01)
*B05D 5/00* (2006.01)

(52) U.S. Cl. ........................ 29/559; 428/172

(58) Field of Classification Search ................ 29/559, 29/281.1; 156/293; 257/777, 724; 273/317.3, 273/357, 340, 119 B; 446/176, 202; 428/172; 427/256
See application file for complete search history.

(56) References Cited

U.S. PATENT DOCUMENTS

| | | | | |
|---|---|---|---|---|
| 2,351,850 A | * | 6/1944 | Wiggins | .................... 137/247 |
| 3,709,236 A | * | 1/1973 | Field et al. | ................ 134/104.4 |
| 3,901,508 A | * | 8/1975 | Spangler | .................. 273/317.3 |
| 5,545,291 A | | 8/1996 | Smith et al. | |
| 5,783,856 A | | 7/1998 | Smith et al. | |
| 2004/0026031 A1 | * | 2/2004 | Smith et al. | .................. 156/293 |

FOREIGN PATENT DOCUMENTS

| | | |
|---|---|---|
| JP | 9120943 | 5/1997 |
| JP | 9506742 | 6/1997 |
| JP | 11-138360 | 5/1999 |
| JP | 2002-082632 | 3/2002 |

\* cited by examiner

*Primary Examiner*—John C Hong
(74) *Attorney, Agent, or Firm*—K&L Gates LLP

(57) ABSTRACT

An element arrangement board and method are provided. Where the element size is comparatively small with respect to the distance in element arrangement and the density of arranged elements is low, the elements can also be arranged with certainty and efficiently in a short period of time. The element arrangement board has an arrangement face on which fitting holes for receiving elements are formed and tapered faces are formed around the fitting holes and inclined downwardly toward the fitting holes. Elements to be arranged are mixed in fluid. The fluid is supplied to the arrangement face of the element arrangement board. The elements are acted upon by force toward the fitting holes on the tapered faces so that they are fitted in a self-aligned fashion into the fitting holes and arranged on the element arrangement board.

8 Claims, 5 Drawing Sheets

PRIOR ART

ELEMENT ARRANGEMENT METHOD

CROSS REFERENCE TO RELATED APPLICATION

This application claims priority to Japanese Patent Document No. 2004-012828, filed on Jan. 21, 2004 with the Japanese Patent Office, which disclosure in its entirety is hereby incorporated by reference.

BACKGROUND OF THE INVENTION

The present invention relates to an element arrangement board and an element arrangement method for arranging a plurality of elements at predetermined positions. More particularly, the present invention relates to an element arrangement board and an element arrangement method for arranging a plurality of elements in a self-aligning fashion using motion of the elements in fluid.

Conventionally, to arrange and assemble elements in a matrix to an image display apparatus, the elements are formed on a board as in a liquid crystal display (LCD) panel or a plasma display panel (PDP). Alternatively, independent LED packages are disposed on a board as in a light emitting diode (LED) display unit. A conventional image display apparatus such as an LCD or a PDP does not allow element isolation with regard to the pitch of elements or pixels. Therefore, elements are usually formed in a spaced relationship from each other by a pixel pitch of the image display apparatus from the beginning of the process of manufacture.

As one of the latest techniques, a method of arranging elements in a self-aligning fashion on a board has been proposed as a mounting method according to fluid self assembly. In the self-aligning fluid self assembly, a large number of elements after production are transmitted in a flow of liquid until they are received by holes formed on the surface of a film, and the film is transferred together with the elements to an apparatus on which the elements are to be mounted. The holes formed in the film are compatible with the elements to be mounted in terms of the shape. In this manner, the large number of elements are taken out in a state wherein they are retained on such a specific film as described above from the fluid and transferred to the apparatus.

Also another technique has been proposed, for example, in U.S. Pat. No. 5,783,856 (hereinafter referred to as Patent Document 1), Japanese Translation of PCT for Patent No. Hei 9-506742 (hereinafter referred to as Patent Document 2) or Japanese Patent Laid-Open No. Hei 9-120943 (hereinafter referred to as Patent Document 3). According to the technique, concave structures for receiving elements are formed on a mounting board on which the elements are to be arranged. Then, in a state wherein the mounting board is placed in the atmospheric air or in fluid, a plurality of semiconductor chips are dispersed so as to be disposed into the concaves in a self-aligning fashion.

Figure 8:
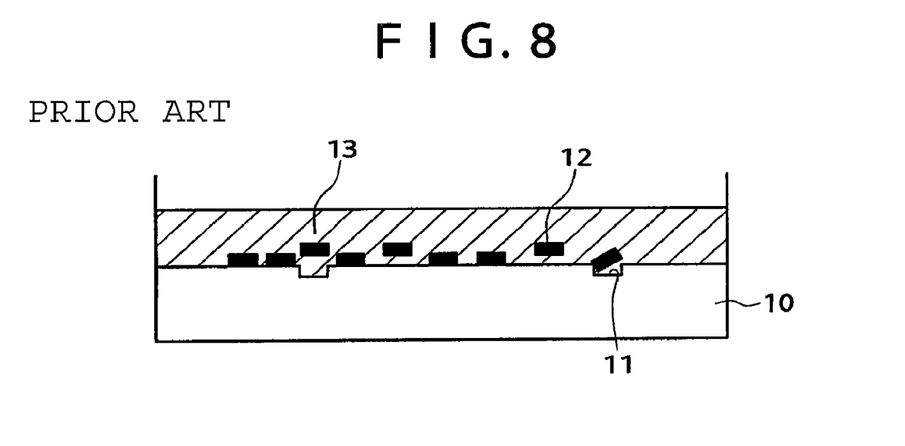
FIG. 8 is a schematic view illustrating a method of supplying elements to a conventional element arrangement board to arrange the elements on the element arrangement board.

The technique disclosed in Patent Documents 1 to 3 mentioned above is illustrated in FIG. 8. Referring to FIG. 8, a flat board 10 having holes 11 formed thereon is immersed in fluid 13. Then, elements 12 for display are thrown into the fluid 13 such that they move in and together with the fluid 13 so that they may be fitted into the holes 11 and mounted on the board 10. In element arrangement, since an element miss which is appearance of a hole 11 in which no element 12 is fitted signifies deterioration of the yield, it is necessary to supply the elements 12 into the holes 11 with certainty so that no such element miss may occur.

Where the board 10 is used directly in an image display apparatus or a like apparatus, the distance between the elements 12 is equal to the pixel pitch. This makes the size of the elements 12 small in comparison with the distance in arrangement between the elements 12. Consequently, the density in which the elements 12 are arranged on the board 10 is comparatively low, and the distance over which an element 12 reaches a hole 11 is long and also the time until an element 12 is fitted into a hole 11 is long accordingly. Thus, to fix the elements 12 with a high yield at the pixel positions at which the holes 11 each in the form of a hole are formed, it is necessary to continue the operation until the elements 12 are fitted into the holes 11 with certainty. Therefore, the technique described has a problem in that the time required before the elements 12 are fitted into all of the holes 11 is long and the throughput is low.

Therefore, to allow the elements 12 to be fitted with certainty into the holes 11 in a short period of time, it is necessary to supply an overwhelmingly greater number of elements 12 than the number of holes 11 formed on the board 10 as seen in FIG. 8. Although only some of the great number of elements 12 supplied on the board 10 are fitted into the holes 11, such supply of an overwhelmingly great number of elements 12 raises the probability that all of the holes 11 may be filled with the elements 12 in a short period of time. Therefore, the time required for mounting of the element 12 can be reduced and the mounting yield can be improved. However, where the size of the elements 12 is comparatively small with respect to the distance in arrangement of the elements 12, it is necessary to prepare and supply a number of elements 12 much greater number than the number of elements 12 to be arranged into the fluid. Therefore, the technique described above has a problem in that the required number of parts is great and a high production cost is required.

SUMMARY OF THE INVENTION

The present invention relates to an element arrangement board and an element arrangement method for arranging a plurality of elements at predetermined positions. More particularly, the present invention relates to an element arrangement board and an element arrangement method for arranging a plurality of elements in a self-aligning fashion using motion of the elements in fluid.

The present invention provides in an embodiment an element arrangement board and an element arrangement method by which the elements can be arranged with certainty and efficiently in a short period of time even though the size of elements is comparatively small with respect to the distance in arrangement of elements and the density in arrangement of elements is low.

According to an embodiment of the present invention, there is provided an element arrangement board for arranging elements at predetermined positions thereon, including:

an element arrangement board body having an arrangement face on which the elements are to be arranged;

the element arrangement board body having recesses formed as holes on the arrangement face thereof, the recesses having a shape substantially complementary to that of the elements;

the element arrangement board body further having inclined tapered faces formed on the arrangement face thereon such that the recesses are positioned at the bottom of the inclined tapered faces.

Since the tapered faces are formed as faces inclined downwardly toward the recesses in the element arrangement board, an element placed on any of the tapered faces is acted upon by force toward the recess and consequently can be moved toward the recess efficiently. Further, if the element is placed on a flat arrangement face, then it repeats random movement similar to Brownian motion when ultrasonic vibrations are applied. However, since a downward slope toward the recess is provided on the tapered face, the probability that the element placed on the tapered face may move toward the fitting hole can be enhanced. Consequently, the element can be moved further efficiently toward the fitting hole. Accordingly, since the time before the element reaches the recess can be shortened, even if the number of elements to be supplied to the arrangement face is decreased when compared with that in the related art techniques, the elements can be fitted into the recesses and arranged with certainty.

Where the area of the tapered faces is greater than ten times the area of the recesses, the elements supplied to the arrangement face can be moved to locations proximate to the recesses efficiently. Further, where the recesses and the tapered faces are formed periodically on the arrangement face of the element arrangement board body, the element arrangement board can be used directly in an image display apparatus or a like apparatus. Each of the recesses may be formed substantially at the center of one of the tapered faces.

According to another embodiment of the present invention, there is provided an element arrangement method for arranging elements at predetermined positions, including supplying fluid having the elements mixed therein to an arrangement face of an element arrangement board, on which recesses each in the form of a hole having a shape substantially complementary to that of the elements and inclined tapered faces at the bottom of which the recesses are positioned are formed, to supply the elements to the arrangement face; and moving the elements in the fluid so that the elements are fitted into the recesses.

In the element arrangement method, since the tapered faces are formed as faces inclined downwardly toward the recesses, an element placed on any of the tapered faces is acted upon by force toward the recess. Consequently, the element can be moved toward the recess efficiently. Further, if the element is placed on a flat arrangement face, then it repeats random movement similar to Brownian motion when ultrasonic vibrations are applied. However, since a downward slope toward the recess is provided on the tapered face, the probability that the element placed on the tapered face may move toward the fitting hole can be enhanced. Consequently, the element can be moved further efficiently toward the fitting hole. Accordingly, since the time before the element reaches the recess can be shortened, even if the number of elements to be supplied to the arrangement face is decreased when compared with that in the related art techniques, the elements can be fitted into the recesses and arranged with certainty.

Where the area of the tapered faces is greater than ten times the area of the recesses, the elements supplied to the arrangement face can be moved to locations proximate to the recesses efficiently. Further, where the recesses and the tapered faces are formed periodically on the arrangement face of the element arrangement board body, the element arrangement board can be used directly in an image display apparatus or a like apparatus. Each of the recesses may be formed substantially at the center of one of the tapered faces.

With the element arrangement board and the element arrangement method, where the element size is smaller than the distance of the element arrangement and the density of the elements to be arranged is comparatively small, element arrangement can also be performed with certainty and efficiently in a short period of time.

Additional features and advantages of the present invention are described in, and will be apparent from, the following Detailed Description of the Invention and the figures.

DETAILED DESCRIPTION OF THE INVENTION

The present invention relates to an element arrangement board and an element arrangement method for arranging a plurality of elements at predetermined positions. More particularly, the present invention relates to an element arrangement board and an element arrangement method for arranging a plurality of elements in a self-aligning fashion using motion of the elements in fluid.

Figure 1:
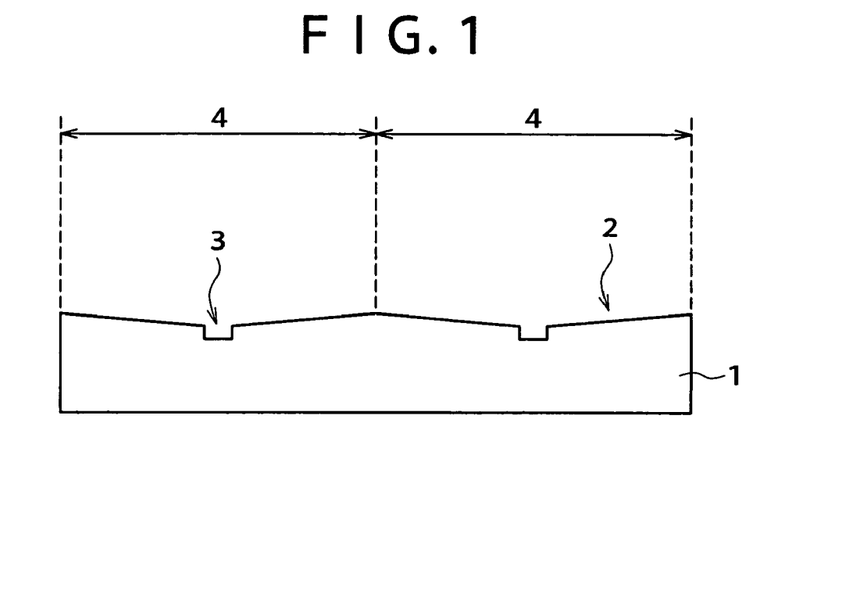
FIG. 1 is a sectional view showing a structure of an element arrangement board according to an embodiment of the present invention.
Figure 2:
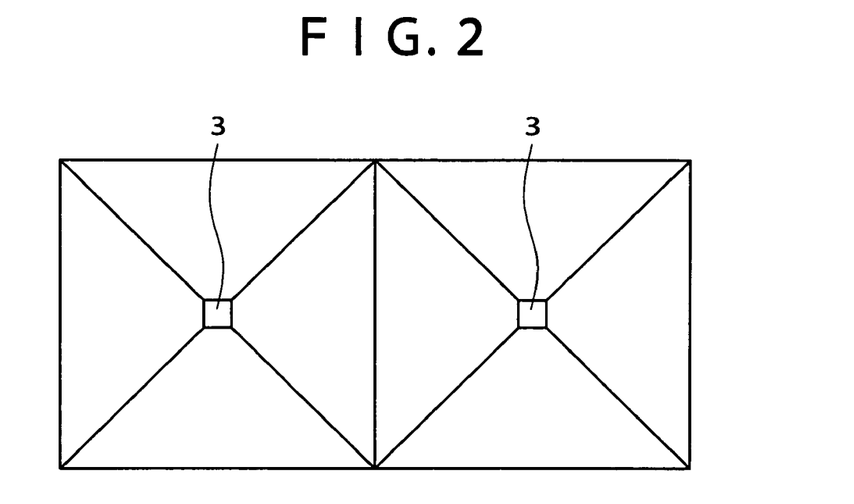
FIG. 2 is a plan view showing the structure of the element arrangement board of FIG. 1.

Referring to FIGS. 1 and 2, a structure of an element arrangement board to which the present invention is applied is shown. According to the element arrangement board and the element arrangement method of the present invention, an arrangement face 2 for arranging elements thereon is formed on one of the opposite faces of an element arrangement board 1 which is a plate-like member. The arrangement face 2 has fitting holes 3 formed thereon for fixedly receiving elements therein. An inclined tapered face 4 is formed in a region of the arrangement face 2 indicated by a double-sided arrow mark around each of the fitting holes 3 such that the fitting hole 3 serves as a bottom therein. While FIG. 1 shows part of the element arrangement board 1 in an enlarged scale, the element arrangement board 1 actually has a size conforming with an object or application of an apparatus on which elements are to be arranged such as an image display apparatus. Therefore, the distance between the fitting holes 3 which is a distance over which elements are to be arranged and the shape of the fitting holes 3, the area and the inclination angle of the tapered faces 4 and so forth may naturally be different from those shown in FIGS. 1 and 2.

The element arrangement board 1 is made of a material with which the arrangement face 2 can be shaped to form the fitting holes 3 and the tapered faces 4 readily, and for example, a resin material or a laminated structure of a glass mat and a resin material as is used for a printed circuit board may be used. To form the fitting holes 3 and the tapered faces 4 on the arrangement face 2 of the element arrangement board 1 as seen in FIGS. 1 and 2, a working method which is used popularly such as extrusion molding wherein a molten resin material is supplied into a mold for formation of the fitting holes 3 and the tapered faces 4 or press work of a resin material wherein a die for formation of the fitting holes 3 and the tapered faces 4 is used. The element arrangement board 1 may be a display board of an image display apparatus to be obtained finally or a board for temporarily retaining elements to be transferred to another board after the elements are arranged.

The arrangement face 2 is one of the opposite faces of the element arrangement board 1 and is positioned on the upper side with respect to the direction of the gravity when elements are to be arranged on the element arrangement board 1. This is because, when the element arrangement method of the present invention is used to perform element arrangement, fluid such as water is supplied to the element arrangement board 1 and elements are thrown into the fluid so that the elements are supplied to the arrangement face 2.

Each of the fitting holes 3 is a concave recess formed on the arrangement face 2 of the element arrangement board 1 and allows a very small element such as a semiconductor chip or a light emitting element to be fitted and fixed therein at a mount position. The fitting holes 3 are formed in a predetermined spaced relationship from each other on the arrangement face 2. Where the element arrangement board 1 is used as a display board of an image display apparatus, the distance between the fitting holes 3 is equal to the pixel pitch. Alternatively, the fitting holes 3 may be formed in a leftwardly and rightwardly asymmetric shape corresponding to that of elements so that not only the arrangement of elements but also the orientation of the elements on the arrangement face 2 may be determined.

Figure 3:
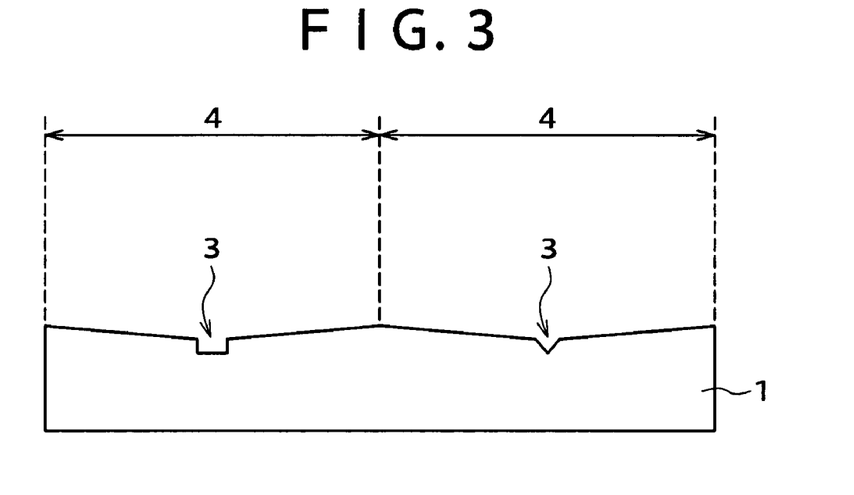
FIG. 3 is a sectional view showing a structure of another element arrangement board according to an embodiment of the present invention on which a plurality of kinds of fitting holes are formed.

Although each of the fitting holes 3 in the example shown in FIGS. 1 and 2 has a shape of a rectangular parallelepiped whose bottom and upper opening have a square shape, the shape of the fitting holes 3 is determined suitably in accordance with the shape of elements to be fitted into the fitting holes 3 and arranged and may be a circular cylindrical shape, a conical shape or a polygonal three-dimensional shape. FIG. 3 shows another example of a configuration of the element arrangement board of the present invention. In particular, a plurality of different types of fitting holes 3 having different shapes from each other may be formed on the arrangement face 2 while a tapered face 4 is formed around each of the fitting holes 3. FIG. 3 particularly shows two fitting holes 3 one of which has a shape of a rectangular parallelepiped and the other of which has a shape of a square pyramid. Where the fitting holes 3 are formed in a plurality of different shapes in this manner, in arrangement of a plurality of different types of elements 5 at individually predetermined positions on the element arrangement plate 1, the types of elements 5 to be fitted into the fitting holes 3 can be determined by making the shapes of the elements 5 to be arranged and the shapes of the fitting holes 3 coincide with each other. Consequently, for example, in such a case that light emitting elements of an image display apparatus for emitting light of red, green and blue are to be arranged at individually predetermined positions, arrangement of the different kinds of elements can be performed in a self-aligning fashion.

Each of the tapered faces 4 is an inclined face formed around a fitting hole 3 and has a gentle downward slope toward the fitting hole 3 to guide an element toward the fitting hole 3. As seen in FIG. 2, a tapered face 4 is formed around each of a plurality of fitting holes 3, and the tapered faces 4 formed around adjacent fitting holes 3 are formed contiguously to each other. In the example shown in the sectional view of FIG. 1 and the plan view of FIG. 2, the shape of a tapered face 4 formed around a fitting hole 3 is a rectangular parallelepiped and the fitting hole 3 is formed at the deepest and substantially central position on the tapered face 4.

The fitting holes 3 and the tapered faces 4 are shown in an enlarged scale in FIGS. 1 and 2. Where the element arrangement board 1 is used directly in an image display apparatus or a like apparatus, the elements fitted in the fitting holes 3 form pixels of the image display apparatus. Therefore, the fitting holes 3 and the tapered faces 4 around the fitting holes 3 are formed periodically in the direction of a row and the direction of a column of the arrangement face 2 on the arrangement face 2. Where the fitting holes 3 and the tapered faces 4 are formed periodically in the directions of a row and a column, it is easy to arrange elements on the element arrangement board of the present invention to be used directly in an image display apparatus.

Although the inclination angle of the tapered faces 4 may be determined arbitrarily, such an inclination angle is required that force for urging the element toward the fitting hole 3 acts upon the element when an element is supplied into a range of a tapered face 4. Further, the tapered face 4 need not have a shape of a square pyramid but may have a curved face such as a conical face or a spherical face. However, the fitting hole 3 must be formed at the lowest position in the tapered face 4. Further, adjacent tapered faces 4 need not be contiguous to each other, but a flat area of the arrangement face 2 may be interposed between adjacent tapered faces 4.

Figure 4:
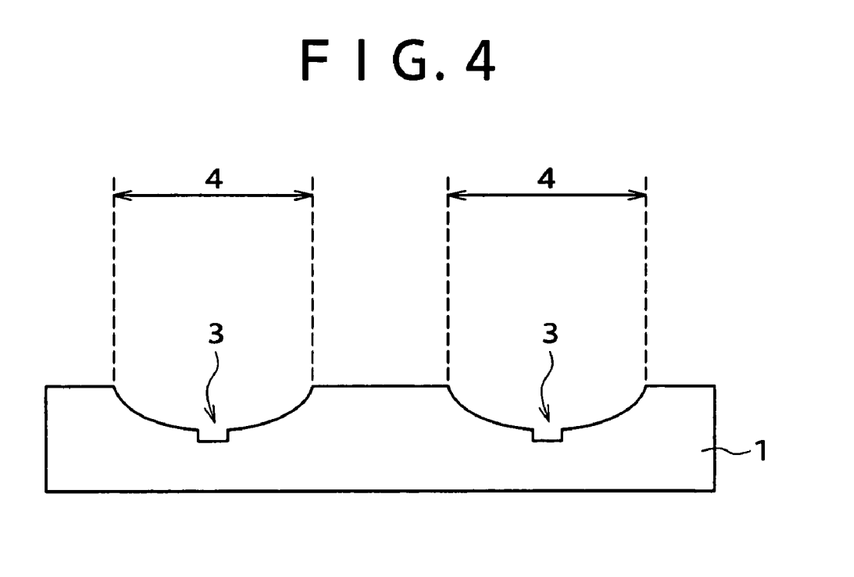
FIG. 4 is a sectional view showing a structure of a further element arrangement board according to an embodiment of the present invention on which tapered areas having a shape of a curved plane are formed in a spaced relationship from each other by a predetermined distance.

FIG. 4 shows a further example of a configuration of the element arrangement board of the present invention. Referring to FIG. 4, tapered faces 4 are formed as curved faces on an arrangement face 2, and a fitting hole 3 is formed at the lowest region of each of the tapered faces 4. Further, the tapered faces 4 are formed in a spaced relationship from each other. Since the inclined face of each of the tapered faces 4 is formed as a curved face, the inclination angle at a position far from the fitting hole 3 is grater than the inclination angle in the proximity of the fitting hole 3. Thus, the force acting to urge an element 5 toward the fitting hole 3 increases as the distance from the fitting hole 3 increases. Therefore, the element 5 can be moved rapidly to a position near to the fitting hole 3. However, in the proximity of the fitting hole 3, the element 5 may repeat a very small movement until it is fitted into the fitting hole 3, and consequently, the probability that the element 5 may be fitted into the fitting hole 3 can be enhanced. Further, the distance by which the tapered faces 4 are formed in a spaced relationship from each other is determined so that the area occupied by the tapered faces 4 and the inclination angle of the tapered faces 4 may have suitable values.

Now, an element arrangement method of the present invention is described with reference to FIG. 5. As described hereinabove, an element arrangement board 1 having an arrangement face 2 on which a plurality of fitting holes 3 and a plurality of tapered faces 4 are formed is immersed in fluid 6, and a plurality of elements 5 to be fitted into the fitting holes 3 are thrown into the fluid 6. Each of the elements 5 has a contour at least part of which is substantially complementary to the contour of a fitting hole 3 and has a size with which it can be fitted into the fitting hole 3 without applying external force such as pressurization to the element 5. Further, the specific gravity of the fluid 6 is lower than that of the element 5 so that the element 5 may not float but sink in the fluid 6.

For example, pure water or alcohol may be used as the fluid 6, and preferably, the fluid 6 can be removed from the arrangement face 2 by evaporation thereof after elements 5 are fitted into the fitting holes 3. Where alcohol which can be evaporated at a comparatively low temperature is used as the fluid 6, the fluid 6 can be removed readily after elements 5 are fitted into the fitting holes 3. Further, when the element arrangement board 1 on which the elements 5 are arranged is taken out from within the fluid 6, an element miss caused by coming off of an element 5 from a fitting hole 3 because of movement within the fluid 6 can be prevented. Furthermore, since the fluid 6 does not remain between the elements 5 and the fitting holes 3, an otherwise possible bad influence of the remaining fluid 6 at a step later than the element arrangement can be prevented.

Figure 5:
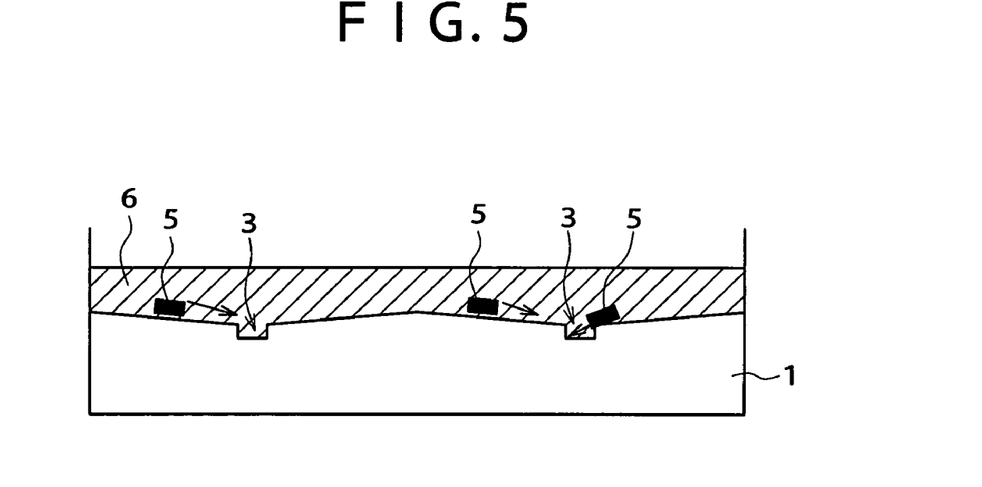
FIG. 5 is a schematic view illustrating a procedure wherein elements are supplied to perform arrangement of the elements on an element arrangement board according to an embodiment of the present invention.

Each element 5 having thrown into the fluid 6 as seen in FIG. 5 sinks downwardly in the fluid 6 in accordance with the gravity until it is received by the surface of a tapered face 4. Since the surface of the tapered face 4 has a downward slope toward the fitting hole 3, drag in a perpendicular direction to the inclination acts upon the element 5, and a component of the gravity in the horizontal direction with respect to the inclined face is applied to the element 5. Consequently, force toward the fitting hole 3 is applied to the element 5. Where the friction between the surface of the tapered face 4 and the element 5 is sufficiently low, the element 5 slidably moves on the surface of the tapered face 4 toward the fitting hole 3. To cause the element 5 to move efficiently toward the fitting hole 3, ultrasonic vibrations may be applied to the fluid 6 or the element arrangement board 1 to make the element 5 oscillate finely. Further, to allow the element 5 to fit in a self-aligned fashion into the fitting hole 3 after it moves to a position in the proximity of the fitting hole 3, the element 5 must turn to a direction conforming to the contour of the fitting hole 3 around the fitting hole 3. Thus, ultrasonic vibrations may be applied to the fluid 6 or the element arrangement board 1 so that the elements 5 may be moved by a very small distance.

Since the tapered face 4 is formed as a downwardly inclined face toward the fitting hole 3, the element 5 placed on the arrangement face 2 in the tapered face 4 is acted upon by force toward the fitting hole 3 and can be moved efficiently toward the fitting hole 3. Further, if ultrasonic vibrations are applied, then the element 5 repeats random movement similar to Brownian motion on a flat arrangement face. However, since a downward slope toward the fitting hole 3 is formed on the tapered face 4, the probability that the element 5 placed on the tapered face 4 may move toward the fitting hole 3 can be enhanced. Consequently, the element 5 can be moved further efficiently toward the fitting hole 3.

Where the element arrangement board and the element arrangement method of the present invention are used to perform arrangement of elements, the element 5 supplied to the arrangement face 2 moves efficiently toward the fitting hole 3. Accordingly, since the time required for the element 5 to reach the fitting hole 3 can be reduced, even if the number of elements 5 to be supplied to the arrangement face 2 is reduced when compared with that according to conventional element arrangement boards and element arrangement methods, the element 5 can be fitted into the fitting hole 3 and arranged with certainty.

To cause an element 5 to move toward a fitting hole 3, the friction between the surface of the tapered face 4 and the element 5 should be reduced as far as possible. Preferably, the surface of the tapered face 4 is formed smooth. Thus, when the tapered faces 4 are formed, working for smoothing the surface of the tapered faces 4 should be applied or a layer having a low coefficient of friction should be formed on the surface of the tapered faces 4. Further, in FIG. 5, while an element arrangement board 1 is immersed in fluid 6 and elements 5 are thrown into the fluid 6, alternatively fluid 6 in which elements 5 are mixed in advance may be supplied to the arrangement face 2 of the element arrangement board 1. In this instance, the fluid 6 in which the elements 5 are mixed may flow on the arrangement face 2. Alternatively, if the fluid 6 and the element 5 are supplied simultaneously to the arrangement face 2, then the element arrangement board 1 may not necessarily be immersed in the fluid 6.

The area of each tapered face 4 is restricted by the distance between the fitting holes 3. If the area of the tapered faces 4 on the element arrangement board 1 is greater than approximately 10 times the area of the fitting holes 3, then the elements 5 can be guided and fitted into the fitting holes 3 effectively. Further, preferably the length of one side of the tapered faces 4 is greater than the length of one side of the fitting holes 3, and hence, the area of the tapered faces 4 is greater than 100 times the area of the fitting holes 3. As the area of the tapered faces 4 increases, the degree of certainty with which the elements 5 mixed in the fluid 6 are received by the tapered faces 4 and acted upon by forward toward the fitting holes 3 increases. Consequently, the elements 5 can be moved to positions in the proximity of and fitted into the fitting holes 3 efficiently as much.

Figure 6:
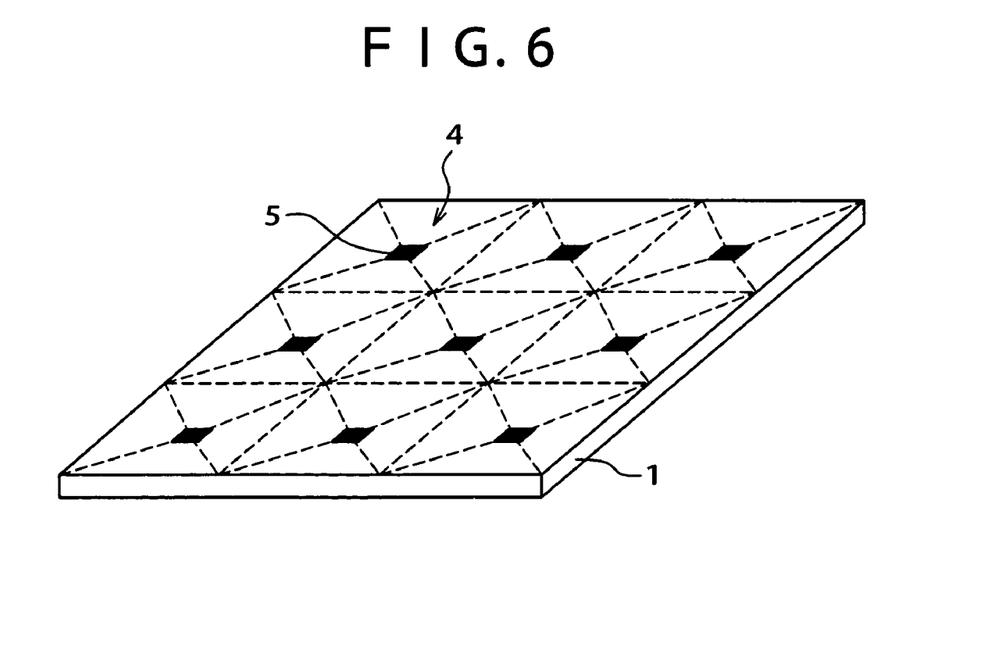
FIG. 6 is a perspective view of an appearance of the element arrangement board of FIG. 5 wherein elements are fitted in fitting holes of and arranged on the element arrangement board.

FIG. 6 shows an appearance of an element arrangement board 1 of the present invention in a state wherein the fluid 6 is evaporated from the element arrangement board 1 on which the element 5 are arranged using the element arrangement method described above. The elements 5 are fitted in a self-aligned fashion and arranged in the fitting holes 3 formed at predetermined distances in the directions of a row and a column on the element arrangement board 1. Since the fitting holes 3 are formed in a spaced relationship from each other by the predetermined distance, the tapered faces 4 formed around the fitting holes 3 are also arranged with an equal area in the directions of a row and a column. Where the fitting holes 3 and the tapered faces 4 are formed periodically on the arrangement face 2 of the element arrangement board 1 and the elements 5 are arranged in a pitch corresponding to the pixel pitch of an image display apparatus, the element arrangement board 1 can be used directly in the image display apparatus.

Figure 7A:
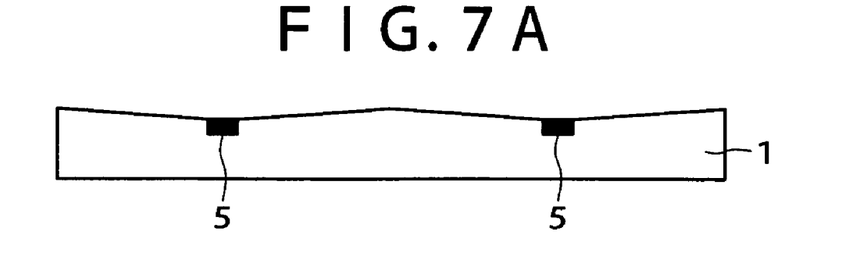
FIGS. 7A to 7D are schematic views illustrating a procedure of producing an image display apparatus by arranging elements on an element arrangement board according to an embodiment of the present invention and forming a wiring layer on the element arrangement board.

FIGS. 7A to 7D illustrate successive steps of an example of a manufacturing procedure of an image display apparatus where the element arrangement board of the present invention is used directly in the image display apparatus. As described hereinabove with reference to FIGS. 1 to 6, fluid 6 in which elements 5 are mixed is supplied to the arrangement face 2 of the element arrangement board 1 on which fitting holes 3 are formed and tapered faces 4 are formed around the fitting holes 3 so that the elements 5 are fitted in a self-aligned fashion into the fitting holes 3 to arrange the elements 5 on the element arrangement board 1 as seen in FIG. 7A.

Figure 7B:
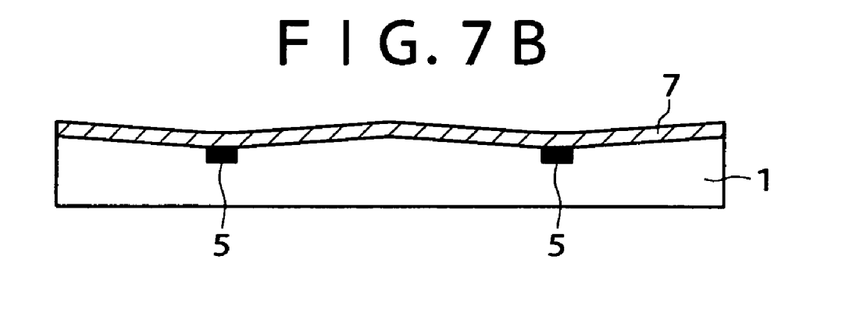

Then, electric wiring lines 7 are formed on the arrangement face 2 to establish electric connection between the elements 5 and the electric wiring lines 7. For the formation of the electric wiring lines 7, a wiring line forming technique which is used popularly can be used. For example, a method may be used wherein a metal layer is formed over an overall area of the arrangement face 2 and a photolithography technique is used so that only the metal layer in a predetermined pattern may remain on the arrangement face 2. The electric wiring lines 7 are formed in stripes such that they contact with the elements 5 arranged in a direction parallel to the plane of the figure. Although moderate convexes and concaves are formed on the arrangement face 2 due to the presence of the tapered faces 4, since the elements 5 are fitted in the fitting holes 3, the tops of the elements 5 and the surfaces of the tapered faces 4 lie on a substantially same plane. Therefore, breaking of the electric wiring lines 7 caused by an offset between the elements 5 and the tapered faces 4 can be prevented even if the electric wiring lines 7 are formed. Further, where the arrangement face 2 is formed as a light emitting face of the elements 5, transparent electrodes are preferably used for the electric wiring lines 7.

Figure 7C:
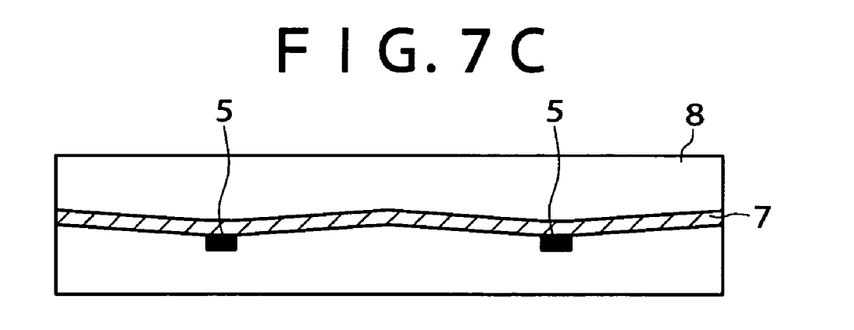

Then, a resin layer 8 is formed on the arrangement face 2 on which the elements 5 are arranged and the electric wiring lines 7 are formed as seen in FIG. 7C. The resin layer 8 assures the strength of the element arrangement board 1 and also protects the electric wiring lines 7. Where the arrangement face 2 is used as a light emitting face of the elements 5, a transparent material which transmits light therethrough is used for the resin layer 8. For the formation of the resin layer 8, a resin laminating technique which is used popularly can be used. For example, a method may be used wherein a thermosetting resin material is applied to the arrangement face 2 by spin coating and then baked at a predetermined temperature so as to cure.

Figure 7D:
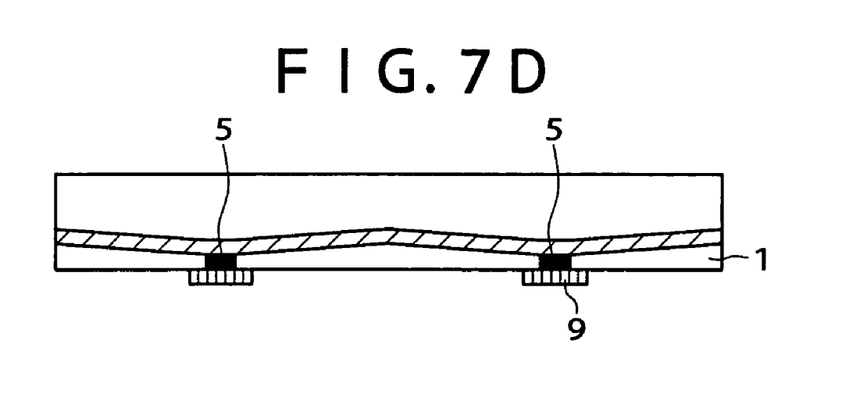

Then, the face of the element arrangement board 1 opposite to the arrangement face 2 is removed by polishing to expose the elements 5. Then, electric wiring lines 9 are formed on the elements 5 to establish electric connection between the elements 5 and the electric wiring lines 9 as seen in FIG. 7D. For the formation of the electric wiring lines 9, a wiring line forming technique which is used popularly can be used. For example, a method may be used wherein a metal layer is laminated first and then a photolithography technique is used so that only the metal layer in a predetermined pattern may remain. The electric wiring lines 9 are formed in stripes such that they contact with the elements 5 arranged in a direction perpendicular to the plane of the figure.

As seen from FIGS. 7A to 7D, electric connection to the elements 5 arranged on the element arrangement board 1 is established using the electric wiring lines 7 formed such that they extend in a direction parallel to the plane of the figures and the electric wiring lines 9 formed such that they extend perpendicularly to the plane of the figures. Consequently, an image display apparatus of the simple matrix driving type can be formed using the electric wiring lines 7 and the electric wiring lines 9 as row electrodes and column electrodes, respectively, to supply electric current to arbitrary ones of the elements 5. Where the fitting holes 3 and the tapered faces 4 are formed periodically at distances corresponding to the pixel pitch of an image display apparatus and the elements 5 are arranged on the element arrangement board 1 of the present invention in this manner, the element arrangement board 1 can be used directly in the image display apparatus.

It is considered that the present invention functions effectively where the chip size of the elements 5 is small and the elements 5 are arranged in various pitches. For example, where element arrangement for a light emitting diode display apparatus is to be performed using a light emitting diode (LED) for the elements 5, the element size of the LED is approximately 15 μm while the pitch between the pixels is approximately 150 μm. Where the element arrangement board and the element arrangement method of the present invention are applied to the application described, element arrangement can be performed with certainty and efficiently in a short period of time.

It is estimated that the decreasing tendency of the size of elements becomes further strong in the field of light emitting diode display in the future. It is also estimated that the target size of the element in the near future becomes approximately 10 μm. On the other hand, as regards the pitch distance of elements, it cannot be estimated that the pitch becomes small suddenly since the visual sense of a human being has some limitation. At least, it seems unlikely that the pitch becomes smaller than approximately 100 μm. Accordingly, in the technical field of light emitting diode display, the possibility that the pitch between elements may become 10 times or more the chip size of elements is high. Thus, where the element arrangement board and the element arrangement method of the present invention are used to arrange elements, element arrangement can be performed with certainty and efficiently in a short period of time.

Further, as described hereinabove, since the tapered faces 4 are formed as downwardly inclined faces toward the fitting holes 3 around the fitting holes 3, the time required for an element 5 to reach a fitting hole 3 can be reduced. Consequently, even if the number of elements 5 to be supplied to the arrangement face 2 is reduced from that required by the related art techniques, the elements 5 can still be fitted into the fitting holes 3 to arrange the elements 5 with certainty. Accordingly, where the element size is smaller than the distance of an element arrangement and the density of the elements to be arranged is comparatively small, element arrangement can also be performed with certainty and efficiently in a short period of time.

While preferred embodiments of the present invention have been described using specific terms, such description is for illustrative purposes only, and it is to be understood that changes and variations may be made without departing from the spirit or scope of the following claims.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. An element arrangement method for arranging display elements of an image display apparatus at predetermined positions, comprising:
   supplying fluid having the display elements mixed therein to an arrangement face of an element arrangement board, on which recesses each in the form of a hole having a shape substantially complementary to that of the display elements and inclined tapered faces at the bottom of which the recesses are positioned are formed, to supply the display elements to the arrangement face; and
   moving the display elements in the fluid so that the display elements are fitted into the recesses wherein an area of the tapered faces is greater than ten times an area of the recesses.

2. The element arrangement method according to claim 1, wherein the recesses and the tapered faces are formed periodically on the arrangement face of the element arrangement board body.

3. The element arrangement method according to claim 1, wherein each of the recesses is formed substantially at the center of one of the tapered faces.

4. The element arrangement method according to claim 1, wherein the display elements are semiconductor chips or light emitting elements.

5. The element arrangement method according to claim 1, wherein the element arrangement board comprises a resin material or a laminated structure of a glass mat and a resin material.

6. The element arrangement method according to claim 1, wherein the element arrangement board is a display board of the image display apparatus.

7. The element arrangement method according to claim 1, wherein the element arrangement board is a board for temporarily retaining the display elements to be transferred to another board after the display elements are arranged.

8. The element arrangement method according to claim 1, further comprising applying ultrasonic vibrations to the fluid or the element arrangement board.

* * * * *